United States Patent
Saiki et al.

(10) Patent No.: US 9,862,007 B2
(45) Date of Patent: Jan. 9, 2018

(54) SUBSTRATE LIQUID PROCESSING APPARATUS AND METHOD, AND COMPUTER-READABLE RECORDING MEDIUM WITH SUBSTRATE LIQUID PROCESSING PROGRAM RECORDED THEREIN

(71) Applicant: Tokyo Electron Limited, Tokyo (JP)

(72) Inventors: Daisuke Saiki, Kumamoto (JP); Shogo Mizota, Kumamoto (JP); Takashi Yabuta, Hsin-chu (TW); Jun Nonaka, Kumamoto (JP); Tatsuya Nagamatsu, Beaverton, OR (US); Koji Tanaka, Kumamoto (JP); Tomiyasu Maezono, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 364 days.

(21) Appl. No.: 14/666,896

(22) Filed: Mar. 24, 2015

(65) Prior Publication Data
US 2015/0273538 A1    Oct. 1, 2015

(30) Foreign Application Priority Data

Apr. 1, 2014  (JP) ................................. 2014-075072
Feb. 17, 2015 (JP) ................................. 2015-028739

(51) Int. Cl.
*B08B 3/14*    (2006.01)
*C11D 11/00*   (2006.01)
(Continued)

(52) U.S. Cl.
CPC ................ *B08B 3/14* (2013.01); *B01D 36/04* (2013.01); *B01D 37/04* (2013.01); *B24B 57/02* (2013.01);
(Continued)

(58) Field of Classification Search
CPC ........ B01D 17/12; B01D 21/30; B01D 21/34; B01D 2221/00; B01D 2221/02;
(Continued)

(56) References Cited

U.S. PATENT DOCUMENTS 5,951,779 A  *  9/1999  Koyanagi ......... H01L 21/02052
                                                      134/2
5,957,759 A  *  9/1999  Cardenas ............ B01F 13/1013
                                                      451/60
(Continued)

FOREIGN PATENT DOCUMENTS

JP        2009-172459 A     8/2009

*Primary Examiner* — Joseph Drodge
(74) *Attorney, Agent, or Firm* — Abelman, Frayne & Schwab

(57) ABSTRACT

Disclosed are a substrate liquid processing apparatus and method for performing a liquid processing on a substrate using a processing liquid, and a computer-readable recording medium with a substrate liquid processing program recorded therein. In the method, a first chemical liquid supply step is performed to supply a first chemical liquid from a first chemical liquid supply unit to a processing liquid storage unit, a first chemical liquid purifying step is performed to purify the first chemical liquid in a chemical liquid purifying unit, a second chemical liquid supply step is performed to supply a second chemical liquid from a second chemical liquid supply unit to the processing liquid storage unit, and a processing liquid supply step is performed to supply the processing liquid obtained by mixing the first and second chemical liquids from the processing liquid supply unit to substrate liquid processing units.

14 Claims, 6 Drawing Sheets

(51) Int. Cl.
*H01L 21/67* (2006.01)
*B24B 57/02* (2006.01)
*B01D 36/04* (2006.01)
*B01D 37/04* (2006.01)

(52) U.S. Cl.
CPC .... *C11D 11/0047* (2013.01); *H01L 21/67017* (2013.01)

(58) Field of Classification Search
CPC .... B01D 2221/14; B01D 36/00; B01D 36/04; B01D 37/00; B01D 37/04; B01D 37/048; B01F 15/00123; B01F 15/00253; B01F 15/02; B01F 15/0201; B01F 15/0216; B01F 15/0441; B01F 15/06; B01F 15/066; B01F 2015/0221; B08B 3/00; B08B 3/04; B08B 3/044; B08B 3/08; B08B 3/10; B08B 3/14; B08B 7/00; B08B 7/0064; B08B 7/0071; B08B 7/04; B08B 13/00; B08B 2203/007; B24B 57/00; B24B 57/02; H01L 21/67; H01L 21/67017; H01L 21/67023; H01L 21/67028
USPC ....... 210/101, 138, 139, 140, 141, 143, 175, 210/194, 198.1, 257.1; 134/10, 19, 26, 134/34, 35, 36, 56, 56 R, 84, 88, 89, 90, 134/94.1, 95.1, 99.1, 105, 107, 108, 109, 134/110, 111; 438/5, 800; 451/36, 60, 451/446
See application file for complete search history.

(56) References Cited

U.S. PATENT DOCUMENTS

| | | | | |
|---|---|---|---|---|
| 6,027,240 | A * | 2/2000 | Han | B01F 3/0803 137/579 |
| 6,224,252 | B1 * | 5/2001 | Munroe | B01F 13/10 366/131 |
| 6,270,246 | B1 * | 8/2001 | Han | B01F 3/0803 137/579 |
| 6,676,766 | B2 * | 1/2004 | Harano | B01F 15/00201 134/2 |
| 6,896,800 | B2 * | 5/2005 | Yamasaki | B01D 61/142 210/196 |
| 7,422,681 | B2 * | 9/2008 | Hiroe | C02F 1/004 134/110 |
| 9,192,605 | B2 * | 11/2015 | Seeman | A61K 31/4515 |
| 9,305,767 | B2 * | 4/2016 | Nishi | H01L 21/02052 |
| 2002/0045412 | A1 * | 4/2002 | Tanaka | B24B 37/04 451/60 |
| 2003/0100247 | A1 * | 5/2003 | Kim | B01F 3/1221 451/60 |
| 2006/0209625 | A1 * | 9/2006 | Jang | B01F 13/1055 366/162.1 |
| 2007/0108113 | A1 * | 5/2007 | Urquhart | B24B 37/00 210/198.1 |
| 2012/0074102 | A1 * | 3/2012 | Magara | C11D 7/08 216/83 |
| 2012/0261339 | A1 * | 10/2012 | Brummer | B01D 61/142 210/636 |
| 2015/0298082 | A1 * | 10/2015 | Machuca | B01F 15/0022 366/152.3 |

* cited by examiner

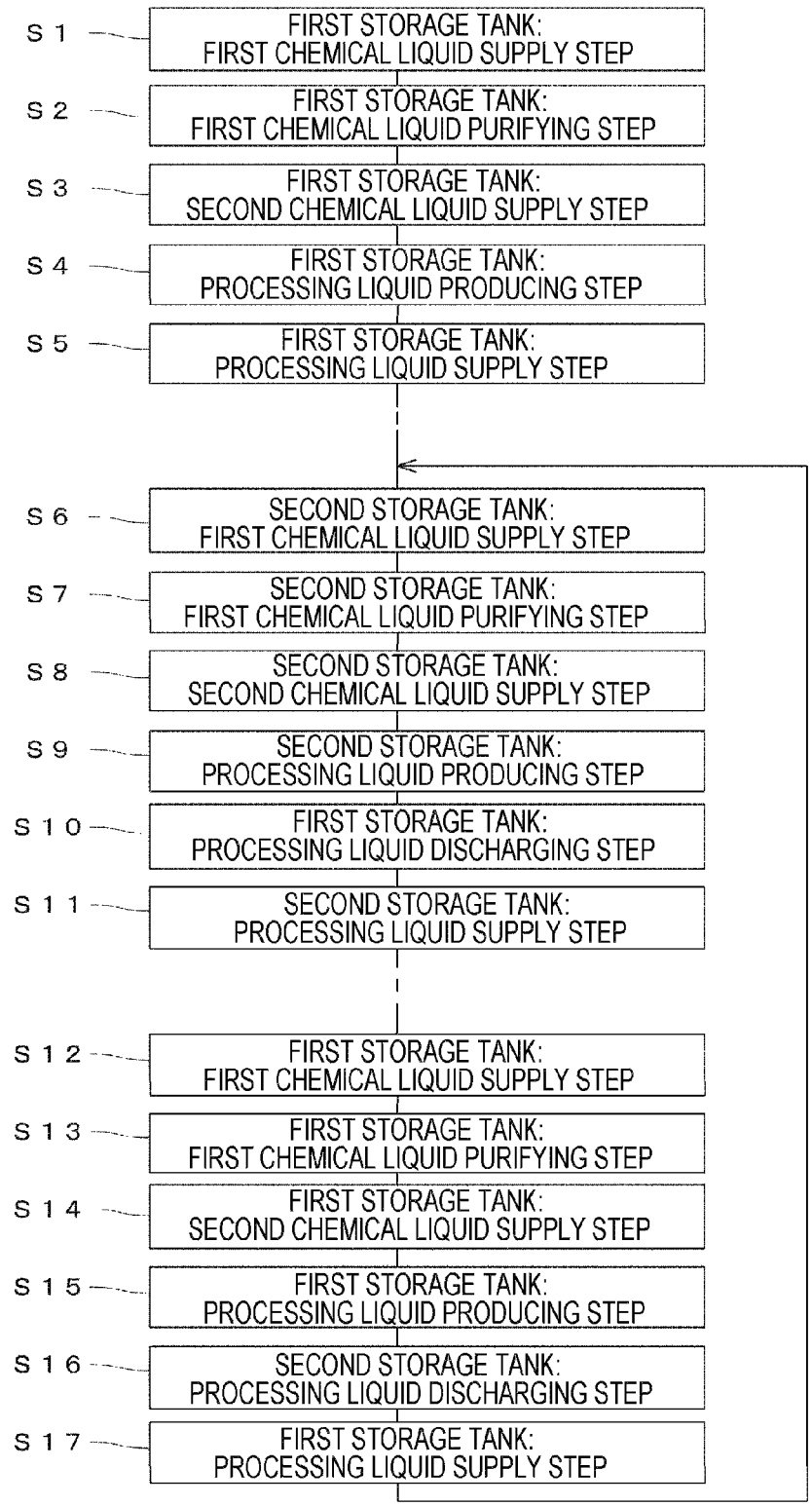

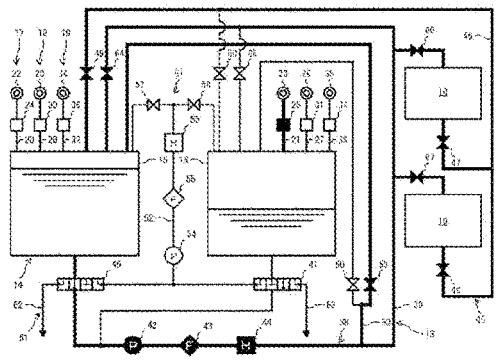

SUBSTRATE LIQUID PROCESSING APPARATUS AND METHOD, AND COMPUTER-READABLE RECORDING MEDIUM WITH SUBSTRATE LIQUID PROCESSING PROGRAM RECORDED THEREIN

CROSS-REFERENCE TO RELATED APPLICATIONS

This application is based on and claims priority from Japanese Patent Application Nos. 2014-075072 and 2015-028739, filed on Apr. 1, 2014 and Feb. 17, 2015, respectively, with the Japan Patent Office, the disclosures of which are incorporated herein in their entireties by reference.

TECHNICAL FIELD

The present disclosure relates to a substrate liquid processing apparatus and method for performing a liquid processing on a substrate using a processing liquid, and a computer-readable recording medium with a substrate liquid processing program recorded therein.

BACKGROUND

In manufacturing, for example, semiconductor parts or flat panel displays, a substrate liquid processing apparatus has conventionally been used for performing various processings such as, for example, cleaning and etching, on substrates such as, for example, semiconductor wafers or liquid crystal substrates.

In the substrate liquid processing apparatus, a liquid processing is performed on a substrate using a processing liquid such as, for example, a cleaning liquid or an etching liquid. As for the processing liquid, for example, a liquid produced by mixing multiple kinds of chemical liquids at a predetermined mixing ratio (concentration), such as, for example, a standard clean-1 (SC-1) liquid (a mixed liquid of hydrogen peroxide, ammonium hydroxide, and pure water), is frequently used.

In a conventional substrate liquid processing apparatus, the respective chemical liquids are supplied at once to a tank at a predetermined mixing ratio in order to produce a processing liquid at a predetermined concentration. Then, in order to remove particles contained in the processing liquid, the processing liquid is circulated for a predetermined length of time or longer using a circulation flow line provided in the tank so that the processing liquid is purified by a filter provided in the circulation flow line. Then, the liquid processing of the substrate is performed using the processing liquid (see, e.g., Japanese Patent Laid-Open Publication No. 2009-172459).

SUMMARY

The present disclosure provides a substrate liquid processing apparatus including: a substrate liquid processing unit configured to process a substrate using a processing liquid; a processing liquid storage unit configured to store the processing liquid; a processing liquid supply unit configured to supply the processing liquid from the processing liquid storage unit to the substrate liquid processing unit; a first chemical liquid supply unit configured to supply a first chemical liquid to the processing liquid storage unit; a second chemical liquid supply unit configured to supply a second chemical liquid to the processing liquid storage unit; a chemical liquid purifying unit configured to circulate and purify the first chemical liquid or the second chemical liquid stored in the processing liquid storage unit; and a control unit configured to control the processing liquid supply unit, the first chemical liquid supply unit, the second chemical liquid supply unit, and the chemical liquid purifying unit, in which the control unit executes: a first chemical liquid supply step of supplying the first chemical liquid from the first chemical liquid supply unit to the processing liquid storage unit; a first chemical liquid purifying step of purifying the first chemical liquid in the chemical liquid purifying unit; a second chemical liquid supply step of supplying the second chemical liquid from the second chemical liquid supply unit to the processing liquid storage unit; and a processing liquid supply step of supplying the processing liquid from the processing liquid supply unit to the substrate liquid processing unit, the processing liquid being produced by mixing the first chemical liquid with the second chemical liquid.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a flow chart illustrating an operation of the substrate liquid processing apparatus.

FIGS. 5A to 5F are explanatory views illustrating an operation of the substrate liquid processing apparatus.

DETAILED DESCRIPTION

Figure 1:
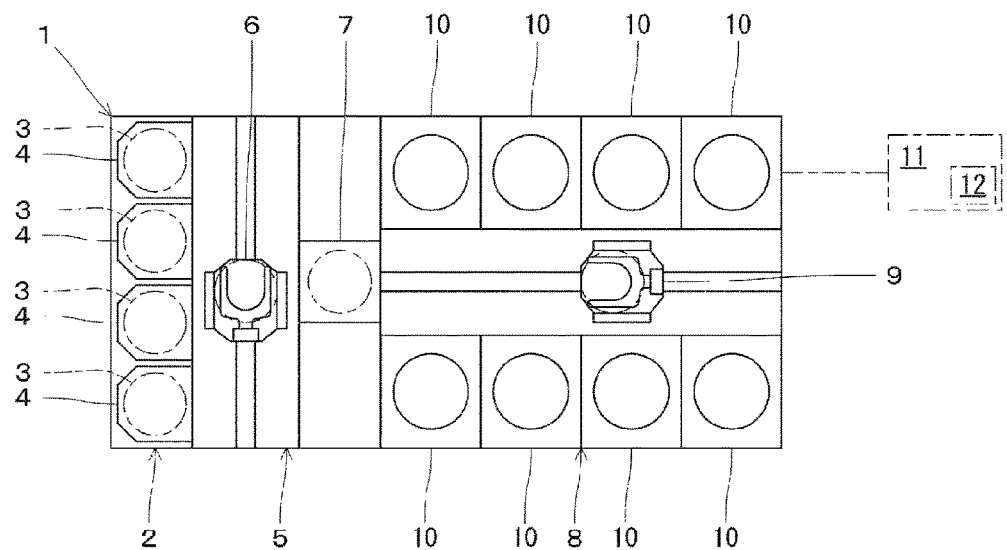
FIG. 1 is a plan view illustrating a substrate liquid processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional substrate liquid processing apparatus described above, the processing liquid is produced by mixing chemical liquids, and is purified, and then, the liquid processing of the substrate is performed using the processing liquid. Thus, the length of time from the mixing of the chemical liquids (the production of the processing liquid) to the usage (the liquid processing) is prolonged.

Therefore, a chemical liquid (the processing liquid) may be deteriorated or decomposed due to, for example, a chemical reaction or a temporal change of the chemical liquids to be mixed with each other, and thus may not exhibit a desired capability as the processing liquid.

An aspect of the present disclosure is to provide a substrate liquid processing apparatus including: a substrate liquid processing unit configured to process a substrate using a processing liquid; a processing liquid storage unit configured to store the processing liquid; a processing liquid supply unit configured to supply the processing liquid from the processing liquid storage unit to the substrate liquid processing unit; a first chemical liquid supply unit configured to supply a first chemical liquid to the processing liquid storage unit; a second chemical liquid supply unit configured to supply a second chemical liquid to the processing liquid storage unit; a chemical liquid purifying unit configured to circulate and purify the first chemical liquid or the second chemical liquid stored in the processing liquid storage unit; and a control unit configured to control the processing liquid supply unit, the first chemical liquid supply unit, the second chemical liquid supply unit, and the chemical liquid purifying unit. The control unit executes: a first chemical liquid supply step of supplying the first chemical liquid from the first chemical liquid supply unit to the processing liquid storage unit; a first chemical liquid purifying step of purifying the first chemical liquid in the chemical liquid purifying unit; a second chemical liquid supply step of supplying the second chemical liquid from the second chemical liquid supply unit to the processing liquid storage unit; and a processing liquid supply step of supplying the processing liquid from the processing liquid supply unit to the substrate liquid processing unit, the processing liquid being produced by mixing the first chemical liquid with the second chemical liquid.

The apparatus further includes a heating unit configured to heat the first chemical liquid or the second chemical liquid stored in the processing liquid storage unit. The control unit initiates driving of the heating unit after the second chemical liquid supply step is initiated.

The control unit executes a processing liquid producing step of producing the processing liquid by mixing the first chemical liquid with the second chemical liquid, between the second chemical liquid supply step and the processing liquid supply step, and the control unit initiates the driving of the heating unit during the processing liquid producing step.

With reference to a timing of initiating the driving of the heating unit, the control unit executes the first chemical liquid supply step ahead of the timing by a first predetermined length of time, and executes the second chemical liquid supply step ahead of the timing by a second predetermined length of time, and when the processing liquid is heated up to a predetermined temperature in the processing liquid producing step, the control unit initiates the processing liquid supply step.

The control unit executes the first chemical liquid purifying step for a length of time longer than a length of time from initiation of the second chemical liquid supply step to initiation of the processing liquid supply step.

The processing liquid storage unit includes a first storage tank and a second storage tank, and the control unit executes the first chemical liquid supply step, the first chemical liquid purifying step, and the second chemical liquid supply step using the second storage tank while the processing liquid supply step using the first storage tank is executed, and the control unit executes the processing liquid supply step using the second storage tank after finishing the processing liquid supply step using the first storage tank.

The chemical liquid purifying unit includes a common first chemical liquid purifying flow line connected to the first and second storage tanks, and a second chemical liquid purifying flow line which diverges from the processing liquid supply unit connected to the first and second storage tanks to be connected to the first and second storage tanks, and while the processing liquid supply step using the first storage tank is performed, the control unit circulates a purified processing liquid through the second chemical liquid purifying flow line and executes purification of the first chemical liquid stored in the second storage tank through the first chemical liquid purifying flow line.

The control unit executes the processing liquid supply step using the first storage tank, after the processing liquid supply step using the first storage tank, the control unit executes a processing liquid discharging step of discharging the processing liquid stored in the first storage tank and then executes the first chemical liquid supply step using the first storage tank, and the control unit executes the second chemical liquid supply step using the first storage tank ahead of the processing liquid supply step using the first storage tank by a predetermined length of time.

Another aspect of the present disclosure is to provide a method of performing a liquid processing on a substrate using a processing liquid. The method includes: a first chemical liquid supply step of supplying a first chemical liquid to a storage tank; a first chemical liquid purifying step of purifying the first chemical liquid; a second chemical liquid supply step of supplying a second chemical liquid to the storage tank; and a processing liquid supply step of supplying a processing liquid obtained by mixing the first chemical liquid with the second chemical liquid to the substrate.

After the second chemical liquid supply step is initiated, heating of the first and second chemical liquids is initiated.

The method further includes a processing liquid producing step of producing the processing liquid by mixing the first chemical liquid with the second chemical liquid, between the second chemical liquid supply step and the processing liquid supply step. The heating of the processing liquid is initiated during the processing liquid producing step.

With reference to a timing of initiating the heating of the processing liquid, the first chemical liquid supply step is executed ahead of the timing by a first predetermined length of time, and the second chemical liquid supply step is executed ahead of the timing by a second predetermined length of time, and the processing liquid supply step is initiated when the processing liquid is heated up to a predetermined temperature in the processing liquid producing step.

The first chemical liquid purifying step is executed for a length of time longer than a length of time from initiation of the second chemical liquid supply step to initiation of the processing liquid supply step.

A first storage tank or a second storage tank is used as the storage tank. While the processing liquid supply step using the first storage tank is executed, the first chemical liquid supply step, the first chemical liquid purifying step, and the second chemical liquid supply step using the second storage tank are executed. After the processing liquid supply step using the first storage tank is finished, the processing liquid supply step using the second storage tank is executed, a processing liquid discharging step of discharging the processing liquid stored in the first storage tank is executed, and then the first chemical liquid supply step using the first storage tank is executed, and the second chemical liquid supply step using the first storage tank is executed ahead of a following processing liquid supply step using the first storage tank by a predetermined length of time.

A further aspect of the present disclosure is to provide a computer-readable recording medium in which a substrate liquid processing program is recorded, the substrate liquid processing program being configured to cause a substrate liquid processing apparatus to execute a liquid processing on a substrate. The liquid processing is performed on the substrate using a processing liquid by performing a first chemical liquid supply step of supplying a first chemical liquid to a storage unit, a first chemical liquid purifying step of purifying the first chemical liquid, a second chemical liquid supply step of supplying a second chemical liquid to the storage tank, and a processing liquid supply step of supplying a processing liquid obtained by mixing the first chemical liquid with the second chemical liquid to the substrate.

In the present disclosure, purification (removal of particles) may be performed without deteriorating a processing liquid, and thus, a liquid processing of a substrate may be satisfactorily performed.

Hereinafter, descriptions will be made on specific configurations of a substrate liquid processing apparatus, a substrate liquid processing method, and a substrate liquid processing program according to the present disclosure, with reference to accompanying drawings.

As illustrated in FIG. 1, a substrate liquid processing apparatus 1 includes a carry-in/out section 2 formed in the front end portion thereof. Carrier 4, each accommodating a plurality of substrates (here, semiconductor wafers) 3 (e.g., 25 substrates), are carried into/carried out from the carry-in/out section 2, and placed to be aligned laterally in the carry-in/out section 2.

The substrate liquid processing apparatus 1 includes a conveyance section 5 formed at the rear side of the carry-in/out section 2. A substrate conveyance device 6 is disposed at the front side of the conveyance section 5, and a substrate delivery stage 7 is disposed at the rear side of the conveyance section 5. In the conveyance section 5, the substrates 3 are conveyed using the substrate conveyance device 6 between any one of the carriers 4 placed in the carry-in/out section 2 and the substrate delivery stage 7.

The substrate liquid processing apparatus 1 includes a processing section 8 formed at the rear side of the conveyance section 5. A substrate conveyance device 9 extending longitudinally is disposed at the center of the processing section 8, and substrate liquid processing units 10 (substrate processing apparatuses) for performing a liquid processing on the substrates 3 are disposed at both left and right sides of the substrate conveyance device 9 to be aligned longitudinally. In the processing section 8, the substrates 3 are conveyed between the substrate delivery stage 7 and each of the substrate liquid processing units 10 using the substrate conveyance device 9, and the liquid processing of the substrates 3 is performed using at least one of the substrate liquid processing units 10.

The substrate liquid processing apparatus 1 includes a control unit 11 (computer), and is controlled by various programs recorded in a recording medium 12 provided in the control unit 11. The recording medium 12 stores various setting data or programs, and is constituted by a conventionally known medium such as, for example, a memory (e.g., a ROM or a RAM), or a disk-type recording medium (e.g., a hard disk, a CD-ROM, a DVD-ROM, or a flexible disk).

Figure 2:
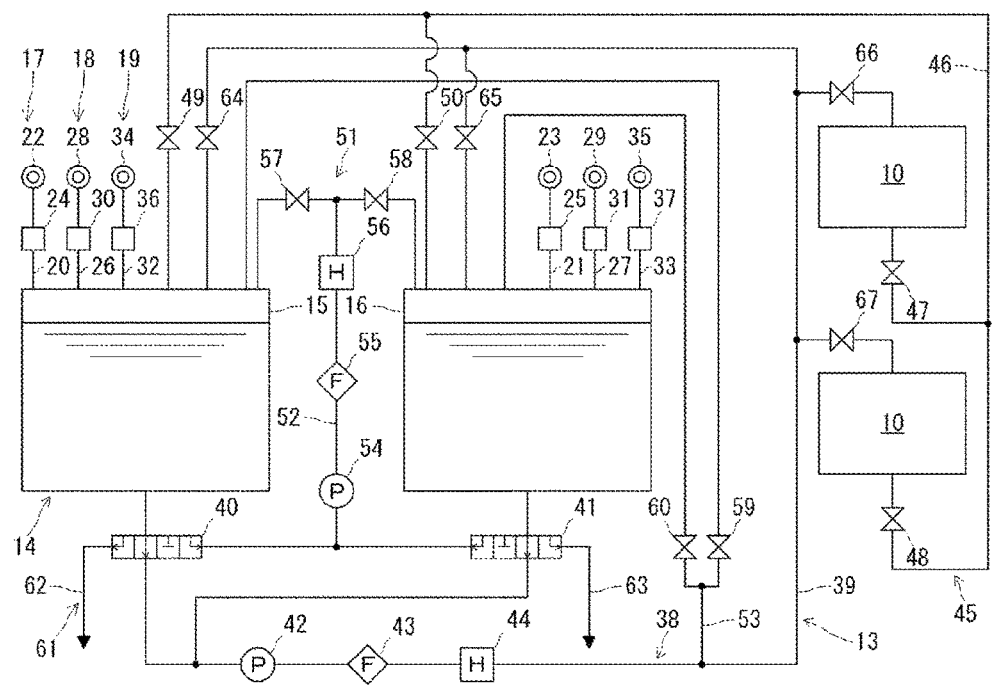
FIG. 2 is an explanatory view illustrating a processing liquid supply mechanism.

A processing liquid supply mechanism 13 is connected to the substrate liquid processing units 10 so as to supply a processing liquid, as illustrated in FIG. 2.

The processing liquid supply mechanism 13 includes a processing liquid storage unit 14 configured to store the processing liquid. The processing liquid storage unit 14 is constituted by a first storage tank 15 and a second storage tank 16. Although the processing liquid storage unit 14 is constituted by two storage tanks here, the processing liquid storage unit 14 may be constituted by one storage tank or three or more storage tanks. As for the processing liquid, a mixed liquid obtained by mixing a first chemical liquid with a second chemical liquid at a predetermined concentration is used, in which an organic chemical liquid (aqueous solution) such as, for example, glycol ethers, is used as the first chemical liquid, and hydrogen peroxide is used as the second chemical liquid.

The processing liquid supply mechanism 13 includes a first chemical liquid supply unit 17, a second chemical liquid supply unit 18, and a pure water supply unit 19 so as to supply a first chemical liquid, a second chemical liquid, and pure water, respectively, to the processing liquid storage unit 14. The first chemical liquid supply unit 17 includes a first chemical liquid supply flow line 20 configured to supply the first chemical liquid to the first storage tank 15, and a first chemical liquid supply flow line 21 configured to supply the first chemical liquid to the second storage tank 16. First chemical liquid supply sources 22 and 23 configured to supply the first chemical liquid are connected to the first chemical liquid supply flow lines 20 and 21 through flow rate controllers 24 and 25, respectively. Likewise, the second chemical liquid supply unit 18 includes a second chemical liquid supply flow line 26 configured to supply the second chemical liquid to the first storage tank 15, and a second chemical liquid supply flow line 27 configured to supply the second chemical liquid to the second storage tank 16. Second chemical liquid supply sources 28 and 29 configured to supply the second chemical liquid are connected to the second chemical liquid supply flow lines 26 and 27 through flow rate controllers 30 and 31, respectively. Also, the pure water supply unit 19 includes a pure water supply flow line 32 configured to supply the pure water to the first storage tank 15, and a pure water supply flow line 33 configured to supply the pure water to the second storage tank 16. Pure water supply sources 34 and 35 configured to supply the pure water are connected to the pure water supply flow lines 32 and 33 through flow rate controllers 36 and 37, respectively. The first chemical liquid supply sources 22 and 23, the second chemical liquid supply sources 28 and 29, or the pure water supply sources 34 and 35 may use a separate supply source for each storage tank or use one common supply source for the storage tanks thereof.

The processing liquid supply mechanism 13 includes a processing liquid supply unit 38 configured to supply the processing liquid from the processing liquid storage unit 14 to the substrate liquid processing units 10. In the processing liquid supply unit 38, a processing liquid supply flow line 39 is connected to the first and second storage tanks 15 and 16 through flow line switch units 40 and 41, and is connected to the first and second storage tanks 15 and 16 through opening/closing valves 64 and 65. The processing liquid supply flow line 39 diverges on the way to be connected to the substrate liquid processing units 10 through opening/closing valves 66 and 67. A pump 42, a filter 43, and a heater 44 are sequentially provided in the processing liquid supply flow line 39. Here, the processing liquid is supplied from the processing liquid supply unit 38 to the two substrate liquid processing units 10. Without being limited thereto, however, the processing liquid may be supplied from the processing liquid supply unit 38 to one substrate liquid processing unit 10 or three or more substrate liquid processing units 10.

The processing liquid supply mechanism 13 includes a processing liquid recovery unit 45 configured to recover the processing liquid from the substrate liquid processing units 10. In the processing liquid recovery unit 45, a processing liquid recovery flow line 46 is connected to the one or more substrate liquid processing units 10 through opening/closing valves 47 and 48, and diverges on the way to be connected to the first and second storage tanks 15 and 16 through opening/closing valves 49 and 50.

The processing liquid supply mechanism 13 includes a chemical liquid purifying unit 51 configured to remove, for example, particles contained in the first chemical liquid or the second chemical liquid so as to purify the chemical liquid. The chemical liquid purifying unit 51 includes a common first chemical liquid purifying flow line 52 directly connected to the first and second storage tanks 15 and 16, and a second chemical liquid purifying flow line 53. The second chemical liquid purifying flow line 53 allows a cleaning liquid to be circulated through the processing liquid supply flow line 39 in its entirety during a filter cleaning process using the cleaning liquid, for example, after exchange of the filter 43, so as to suppress contamination of the processing liquid supply flow line 39. The second chemical liquid purifying flow line 53 is effective for reducing a time required for a filter cleaning process. The first chemical liquid purifying flow line 52 has an upstream portion connected to the first and second storage tanks 15 and 16 through the flow line switch units 40 and 41, respectively, and a downstream portion which diverges to be connected to the first and second storage tanks 15 and 16 through opening/closing valves 57 and 58, in which a pump 54, a filter 55, and a heater 56 are sequentially provided in the middle of the first chemical liquid purifying flow line 52. The second chemical liquid purifying flow line 53 has an upstream portion which also serves as the processing liquid supply flow line 39, diverges on the way from the processing liquid supply flow line 39, and has a downstream portion connected to the first and second storage tanks 15 and 16 through opening/closing valves 59 and 60. Although not illustrated, an opening/closing valve may be provided in the processing liquid supply flow line 39 between a junction of the processing liquid supply flow line 39 and the second chemical liquid purifying flow line 53, and a junction of the processing liquid supply flow line 39 and the substrate liquid processing units. The chemical liquid purifying unit 51 performs purification of the chemical liquid (the processing liquid) by the filter 55 provided in the first chemical liquid purifying flow line 52, and the filter 43 provided in the portion of the second chemical liquid purifying flow line 53 which also serves as the processing liquid supply flow line 39. Here, the common first chemical liquid purifying flow line 52 directly connected to the first and second storage tanks 15 and 16 is formed, but, separate chemical liquid purifying flow lines directly connected to the first storage tank 15 and the second storage tank 16, respectively, may be formed. When the common chemical liquid purifying flow line is formed for the first and second storage tanks 15 and 16, the size or the cost of the substrate liquid processing apparatus 1 may be reduced as compared to a case where the separate chemical liquid purifying flow lines are formed for the first and second storage tanks 15 and 16. Since the common first chemical liquid purifying flow line 52 directly connected to the first and second storage tanks 15 and 16, and the second chemical liquid purifying flow line 53 provided between the first and second storage tanks 15 and 16 and the processing liquid supply unit 38 are provided, it is possible to perform purification of the chemical liquid for one of the first and second storage tanks 15 and 16 through the first chemical liquid purifying flow line 52 while the purified processing liquid is circulated through the second chemical liquid purifying flow line 53 during the supply of the purified processing liquid from the other of the first and second storage tanks 15 and 16 to the substrate liquid processing units 10.

The processing liquid supply mechanism 13 includes a processing liquid waste unit 61 configured to waste the processing liquid. In the processing liquid waste unit 61, drains 62 and 63 are connected to the first and second storage tanks 15 and 16 through the flow line switch units 40 and 41.

The substrate liquid processing apparatus 1 is configured as described above, and the control unit 11 controls the respective units according to the substrate liquid processing program (see, e.g., FIG. 3) recorded in the recording medium 12 as described below so as to perform the liquid processing of the substrates 3.

Figure 4A:
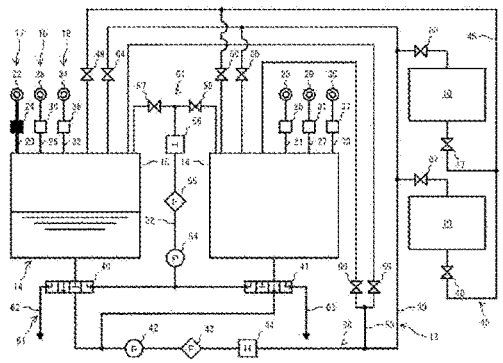
FIGS. 4A to 4E are explanatory views illustrating an operation of the substrate liquid processing apparatus.

First, the substrate liquid processing apparatus 1 performs a first chemical liquid supply step S1 of supplying the first chemical liquid to the first storage tank 15. In the first chemical liquid supply step S1 using the first storage tank 15, as illustrated in FIG. 4A, the flow line switch unit 40 is closed, and the flow rate controller 24 is controlled so that the first chemical liquid in a predetermined amount is supplied based on the predetermined mixing ratio from the first chemical liquid supply source 22 to the first storage tank 15. Accordingly, the first chemical liquid in the predetermined amount is stored in the first storage tank 15.

Figure 4B:
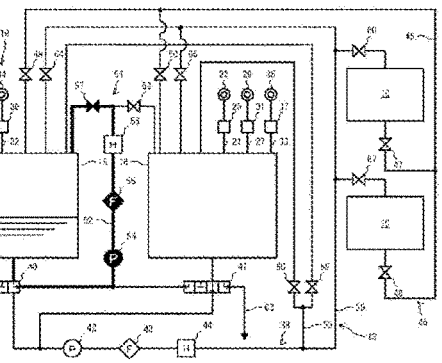

Next, the substrate liquid processing apparatus 1 performs a first chemical liquid purifying step S2 of purifying the first chemical liquid stored in the first storage tank 15. In the first chemical liquid purifying step S2 using the first storage tank 15, as illustrated in FIG. 4B, the flow line switch unit 40 is communicated with the first chemical liquid purifying flow line 52, the opening/closing valve 57 communicating with the first storage tank 15 is opened, the opening/closing valve 58 communicating with the second storage tank 16 is closed, and the pump 54 is driven. Accordingly, the first chemical liquid stored in the first storage tank 15 is purified by being continuously circulated between the first storage tank 15 and the first chemical liquid purifying flow line 52 so that, for example, particles are removed by the filter 55. Here, the heater 56 as a heating unit is not driven while the first chemical liquid maintained at a low temperature (room temperature) is circulated, so that deterioration of the first chemical liquid by heat may be suppressed.

Figure 4C:
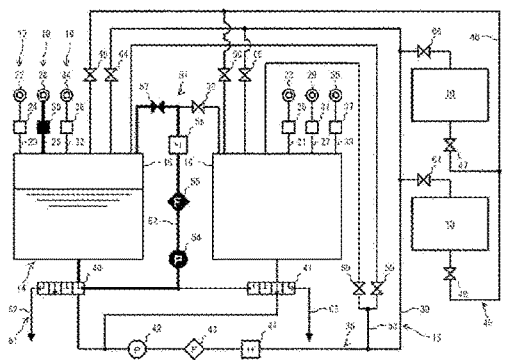

Next, the substrate liquid processing apparatus 1 performs a second chemical liquid supply step S3 of supplying the second chemical liquid to the first storage tank 15. In the second chemical liquid supply step S3 using the first storage tank 15, as illustrated in FIG. 4C, the flow rate controller 30 is controlled so that the second chemical liquid in a predetermined amount is supplied based on the predetermined mixing ratio from the second chemical liquid supply source 28 to the first storage tank 15. Accordingly, in addition to the first chemical liquid in the predetermined amount stored in advance, the second chemical liquid in the predetermined amount is stored in in the first storage tank 15. The first chemical liquid and the second chemical liquid in the predetermined amounts are stored in the first storage tank 15 at a predetermined mixing ratio. In the second chemical liquid supply step S3 using the first storage tank 15, subsequently to the first chemical liquid purifying step S2 using the first storage tank 15, the flow line switch unit 40 is communicated with the first chemical liquid purifying flow line 52, the opening/closing valve 57 communicating with the first storage tank 15 is opened, the opening/closing valve 58 communicating with the second storage tank 16 is closed, and the pump 54 is driven without driving the heater 56. Accordingly, the first chemical liquid and the second chemical liquid are gradually stirred and mixed at a low temperature (room temperature).

Figure 4D:
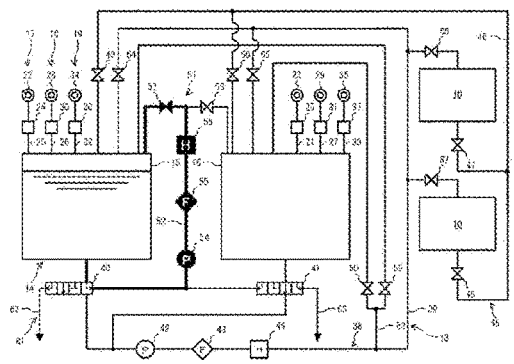

Next, the substrate liquid processing apparatus 1 performs a processing liquid producing step S4 of producing a processing liquid at a predetermined temperature by mixing and heating the first chemical liquid and the second chemical liquid stored in the first storage tank 15. In the processing liquid producing step S4 using the first storage tank 15, as illustrated in FIG. 4D, subsequently to the second chemical liquid supply step S3 using the first storage tank 15, the flow line switch unit 40 is communicated with the first chemical liquid purifying flow line 52, the opening/closing valve 57 communicating with the first storage tank 15 is opened, the opening/closing valve 58 communicating with the second storage tank 16 is closed, and the pump 54 is driven. In the processing liquid producing step S4 using the first storage tank 15, the driving of the heater 56 is initiated. Accordingly, the first chemical liquid and the second chemical liquid are heated by the heater 56 while being stirred and mixed, so that the processing liquid at the predetermined temperature is produced. Since moisture or hydrogen peroxide contained in the processing liquid is evaporated through heating, the second chemical liquid or the pure water may be supplied in a predetermined amount to the first storage tank 15 by controlling the flow rate controllers 30 and 36.

Figure 4E:
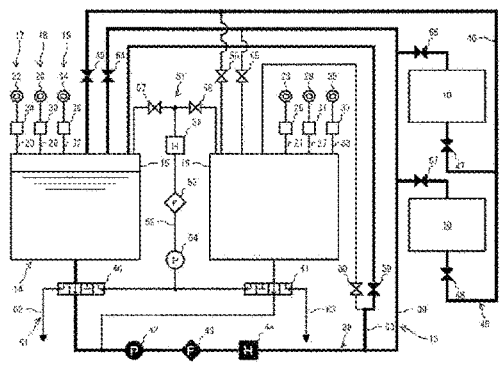

Next, the substrate liquid processing apparatus 1 performs a processing liquid supply step S5 of supplying the processing liquid from the first storage tank 15 to the substrate liquid processing units 10. In the processing liquid supply step S5 using the first storage tank 15, as illustrated in FIG. 4E, the flow line switch unit 40 is communicated with the processing liquid supply flow line 39, and the pump 42 and the heater 44 as a heating unit are driven. Accordingly, the processing liquid stored in the first storage tank 15 is purified by removing, for example, particles using the filter 43, and then supplied to the substrate liquid processing units 10 through the opening/closing valves 66 and 67. The flow rate of the processing liquid to be supplied to each of the substrate liquid processing units 10 is controlled by a flow rate controller provided in each of the substrate liquid processing units 10. In the processing liquid supply step S5 using the first storage tank 15, the opening/closing valves 59 and 64 communicating with the first storage tank 15 are opened, and the opening/closing valves 60 and 65 communicating with the second storage tank 16 are closed so that a part of the processing liquid not supplied to the substrate liquid processing units 10 is returned to the first storage tank 15. Accordingly, the processing liquid stored in the first storage tank 15 is purified by being continuously circulated between the first storage tank 15 and the second chemical liquid purifying flow line 53 so that, for example, particles are removed by the filter 43. In the processing liquid supply step S5 using the first storage tank 15, the opening/closing valves 47 and 48 provided in the processing liquid recovery flow line 46 are opened, the opening/closing valve 49 communicating with the first storage tank 15 is opened, and the opening/closing valve 50 communicating with the second storage tank 16 is closed to recover the processing liquid from the substrate liquid processing units 10.

As described above, the processing liquid is supplied from the first storage tank 15 to each of the substrate liquid processing units 10, and the liquid processing on the substrates 3 is performed using the processing liquid in each of the substrate liquid processing units 10. As the liquid processing on the substrates 3 is gradually performed, moisture or hydrogen peroxide contained in the processing liquid is evaporated through heating. Therefore, the second chemical liquid or the pure water is supplied in a predetermined amount to the first storage tank 15 by controlling the flow rate controllers 30 and 36 according to, for example, the number of processed substrates 3. As the liquid processing on the substrates 3 is gradually performed, the processing capability or the amount of the processing liquid stored in the first storage tank 15 is reduced. Accordingly, in the substrate liquid processing apparatus 1, as described below, the processing liquid stored in the first storage tank 15 is wasted and then a new processing liquid is replenished in the first storage tank 15 so as to replace the processing liquid in the first storage tank 15.

First, the substrate liquid processing apparatus 1 wastes the processing liquid stored in the first storage tank 15. In this case, the substrate liquid processing apparatus 1 performs a first chemical liquid supply step S6 of supplying the first chemical liquid to the second storage tank 16 while the processing liquid supply step S5 using the first storage tank 15 is executed. In the first chemical liquid supply step S6 using the second storage tank 16, under the same control as that of the first chemical liquid supply step S1 using the first storage tank 15, the first chemical liquid in a predetermined amount is supplied from the first chemical liquid supply source 23 to the second storage tank 16, as illustrated in FIG. 5A.

Then, the substrate liquid processing apparatus 1 performs a first chemical liquid purifying step S7 of purifying the first chemical liquid stored in the second storage tank 16. In the first chemical liquid purifying step S7 using the second storage tank 16, under the same control as that of the first chemical liquid purifying step S2 using the first storage tank 15, the first chemical liquid stored in the second storage tank 16 is continuously circulated between the second storage tank 16 and the first chemical liquid purifying flow line 52 so that, for example, particles are removed from the first chemical liquid by the filter 55, as illustrated in FIG. 5B.

Then, the substrate liquid processing apparatus 1 performs a second chemical liquid supply step S8 of supplying the second chemical liquid to the second storage tank 16. In the second chemical liquid supply step S8 using the second storage tank 16, under the same control as that of the second chemical liquid supply step S3 using the first storage tank 15, the second chemical liquid in a predetermined amount is supplied from the second chemical liquid supply source 29 to the second storage tank 16, as illustrated in FIG. 5C.

Then, the substrate liquid processing apparatus 1 performs a processing liquid producing step S9 of producing a processing liquid at a predetermined temperature by mixing and heating the first chemical liquid and the second chemical liquid stored in the second storage tank 16. In the processing liquid producing step S9 using the second storage tank 16, under the same control as that of the processing liquid producing step S4 using the first storage tank 15, the first chemical liquid and the second chemical liquid are stirred and mixed, while being heated by the heater 56 so as to produce the processing liquid at the predetermined temperature, as illustrated in FIG. 5D.

Then, the substrate liquid processing apparatus 1 performs a processing liquid discharging step S10 of discharging the processing liquid stored in the first storage tank 15. In the processing liquid discharging step S10 using the first storage tank 15, the execution of the processing liquid supply step S5 using the first storage tank 15 is stopped, and the flow line switch unit 40 is communicated with the drain 62, as illustrated in FIG. 5E, so that the processing liquid stored in the first storage tank 15 is wasted to the outside through the drain 62. Accordingly, the processing liquid is discharged so that the first storage tank 15 is placed in an empty state.

Next, the substrate liquid processing apparatus 1 performs a processing liquid supply step S11 of supplying the processing liquid from the second storage tank 16 to the substrate liquid processing units 10. In the processing liquid supply step S11 using the second storage tank 16, under the same control as that of the processing liquid supply step S5 using the first storage tank 15, the processing liquid stored in the second storage tank 16 is supplied to the substrate liquid processing units 10, as illustrated in FIG. 5F.

In this manner, in the substrate liquid processing apparatus 1, the processing liquid stored in the first storage tank 15 is wasted. At this time, the substrate liquid processing apparatus 1 executes the first chemical liquid supply step S6, the first chemical liquid purifying step S7, the second chemical liquid supply step S8, and the processing liquid producing step S9 using the second storage tank 16 while the processing liquid supply step S5 using the first storage tank 15 is executed. Subsequently, immediately after the processing liquid discharging step S10 using the first storage tank 15 is executed, the processing liquid supply step S11 using the second storage tank 16 may be executed. Accordingly, a length of time, during which the substrates 3 cannot be processed in the substrate liquid processing units 10 of the substrate liquid processing apparatus 1, may be shortened, thereby improving the throughput of the substrate liquid processing apparatus 1.

The substrate liquid processing apparatus 1 replenishes a new processing liquid after wasting the processing liquid stored in the first storage tank 15. In this case, the substrate liquid processing apparatus 1 performs a first chemical liquid supply step S12, a first chemical liquid purifying step S13, a second chemical liquid supply step S14, and a processing liquid producing step S15 using the first storage tank 15 as illustrated in FIGS. 6A to 6D, while the processing liquid supply step S11 using the second storage tank 16 is executed. The first chemical liquid supply step S12, the first chemical liquid purifying step S13, the second chemical liquid supply step S14, and the processing liquid producing step S15 using the first storage tank 15 are performed under the same control as that of the first chemical liquid supply step S1, the first chemical liquid purifying step S2, the second chemical liquid supply step S3, and the processing liquid producing step S4.

Figure 6A:
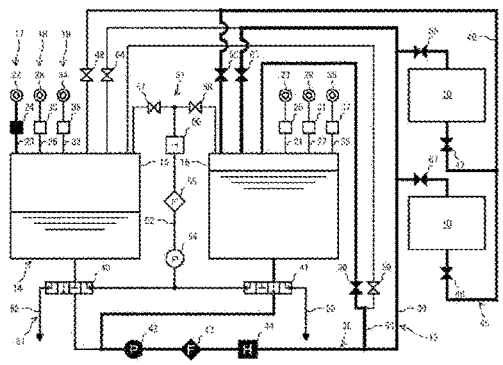
FIGS. 6A to 6F are explanatory views illustrating an operation of the substrate liquid processing apparatus.
Figure 6B:
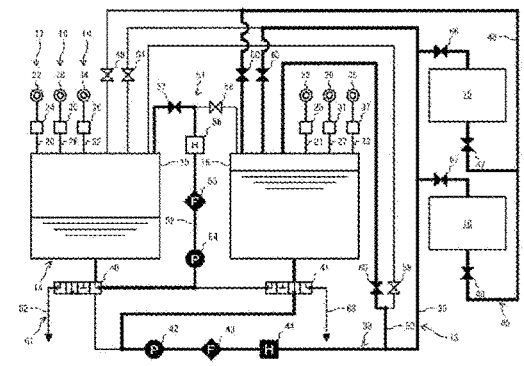
Figure 6C:
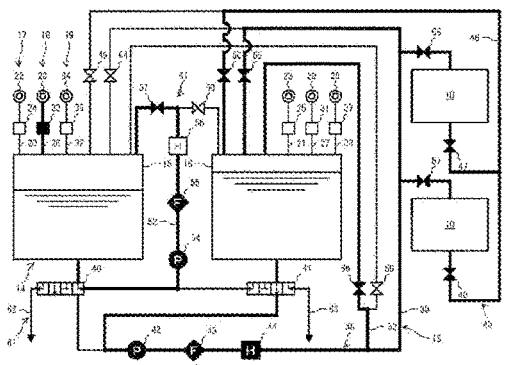
Figure 6D:
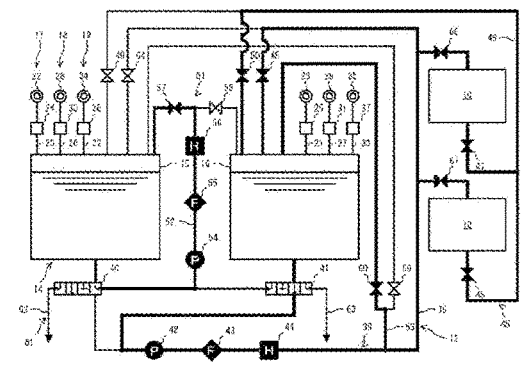
Figure 6E:
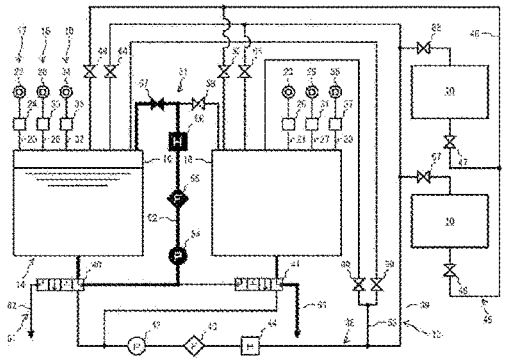
Figure 6F:
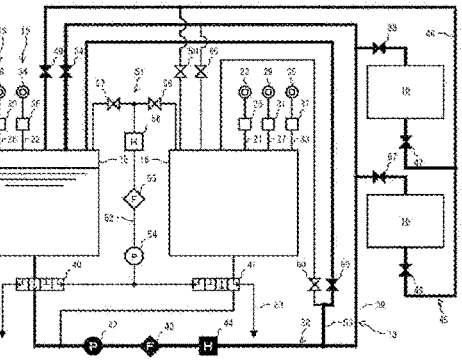

Then, the substrate liquid processing apparatus 1 stops the execution of the processing liquid supply step S11 using the second storage tank 16, and performs a processing liquid discharging step S16 using the second storage tank 16, and a processing liquid supply step S17 using the first storage tank 15, as illustrated in FIGS. 6E and 6F. Accordingly, immediately after the processing liquid stored in the second storage tank 16 is wasted, the processing liquid is supplied from the first storage tank 15 to the substrate liquid processing units 10. The processing liquid discharging step S16 using the second storage tank 16, and the processing liquid supply step S17 using the first storage tank 15 are performed under the same control as that of the processing liquid discharging step S10 using the first storage tank 15, and the processing liquid supply step S11 using the second storage tank 16.

In this manner, the substrate liquid processing apparatus 1 executes the first chemical liquid supply step S6, the first chemical liquid purifying step S7, the second chemical liquid supply step S8, and the processing liquid producing step S9 using the second storage tank 16 during the execution of the processing liquid supply step S5 using the first storage tank 15, executes the processing liquid discharging step S10 using the first storage tank 15, and then executes the processing liquid supply step S11 using the second storage tank 16 so that an exchange of the processing liquid stored in the second storage tank is performed. Also, the substrate liquid processing apparatus 1 executes the first chemical liquid supply step S12, the first chemical liquid purifying step S13, the second chemical liquid supply step S14, and the processing liquid producing step S15 using the first storage tank 15 during the execution of the processing liquid supply step S11 using the second storage tank 16, executes the processing liquid discharging step S16 using the second storage tank 16, and then, executes the processing liquid supply step S17 using the first storage tank 15 so that the exchange of the processing liquid stored in the first storage tank 15 is performed.

The substrate liquid processing apparatus 1 continuously alternately performs the processing liquid exchange of the first storage tank 15 and the processing liquid exchange of the second storage tank 16. In this case, the execution of the first chemical liquid supply step S6 using the second storage tank 16 or the execution of the first chemical liquid supply step S12 using the first storage tank 15 may be initiated after the execution of the processing liquid supply step S17 using the first storage tank 15 or the execution of the processing liquid supply step S11 using the second storage tank 16 is initiated. For example, a time to initiate the execution of the processing liquid discharging step S10 of discharging the processing liquid from the first storage tank 15 or the processing liquid discharging step S16 of discharging the processing liquid from the second storage tank 16 may be artificially or automatically set in advance, and then, the execution of the first chemical liquid supply step S6 using the second storage tank 16 or the first chemical liquid supply step S12 using the first storage tank 15 may be initiated ahead of the set time by a predetermined length of time (e.g., 20 hours). The execution of the second chemical liquid supply step S8 using the second storage tank 16 or the second chemical liquid supply step S14 using the first storage tank 15 may be initiated ahead of the set time by a predetermined length of time (e.g., 1 hour), and then, the execution of the processing liquid producing step S9 using the second storage tank 16 or the processing liquid producing step S15 using the first storage tank 15 may be initiated ahead of the set time by a predetermined length of time (e.g., 30 minutes). In such a case, when each of the first chemical liquid purifying steps S7 and S13 is performed for a length of time longer than the length of time from the initiation of each of the second chemical liquid supply steps S8, and S14 to the initiation of each of the processing liquid supply steps S11 and S17, the removal of, for example, particles contained in the first chemical liquid may be facilitated, and as a result, the first chemical liquid may be satisfactorily purified. Based on the set time described above, the initiation of the first chemical liquid supply step may be set to be executed ahead of the set time by a predetermined length of time, and based on the time to initiate the first chemical liquid supply step, the second chemical liquid supply step or the processing liquid producing step may be set to be executed after a predetermined length of time from the initiation of the first chemical liquid supply step (ahead of the set time).

As described above, in the substrate liquid processing apparatus 1, after the first chemical liquid is supplied to each of the storage tanks 15 and 16, the first chemical liquid is purified, and then the second chemical liquid is supplied to each of the storage tanks 15 and 16 so that the first chemical liquid and the second chemical liquid are mixed with each other to produce a processing liquid. Thus, the purification (removal of particles) may be performed without deteriorating the processing liquid, and thus, a liquid processing of the substrates 3 may be satisfactorily performed.

Figure 7:
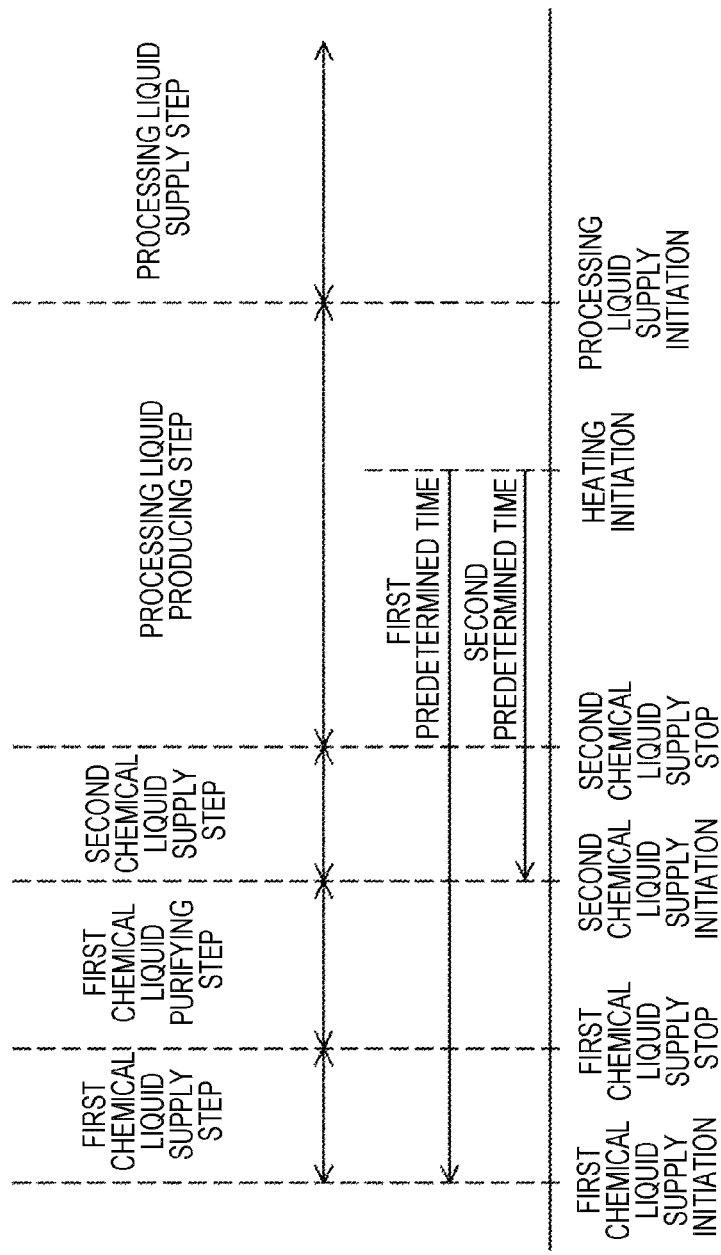
FIG. 7 is a timing chart illustrating an operation of the substrate liquid processing apparatus

The substrate liquid processing apparatus 1, as illustrated in FIG. 7, initiates the heating through a heating unit after initiating the second chemical liquid supply step (during the processing liquid producing step), while sequentially performing the first chemical liquid supply step, the first chemical liquid purifying step, the second chemical liquid supply step, the processing liquid producing step, and the processing liquid supplying step. Accordingly, deterioration of the first or second chemical liquid by heat may be suppressed. In the substrate liquid processing apparatus 1, with reference to a timing of initiating the heating through the heating unit, the control unit 11 may perform a control such that the first chemical liquid supply step (supply of the first chemical liquid) is initiated ahead of the timing by a first predetermined length of time, and the second chemical liquid supply step (supply of the second chemical liquid) is initiated ahead of the timing by a second predetermined length of time. Also, the control unit 11 may perform a control such that the processing liquid supply step is initiated when the processing liquid is heated up to a predetermined temperature after initiating the heating. In this case, the processing liquid, besides the first and second chemical liquids, is not heated unnecessarily, and thus, deterioration of all the first chemical liquid, the second chemical liquid, and the processing liquid by heat may be suppressed. Further, the reaction between the first chemical liquid and the second chemical liquid may be suppressed. Thus, the liquid processing of the substrates 3 may be further satisfactorily performed.

The processing liquid may be, for example, a cleaning liquid or an etching liquid as long as the processing liquid is a mixed liquid of the first chemical liquid and the second chemical liquid. The first chemical liquid or the second chemical liquid may be a mixed liquid of multiple kinds of organic chemical liquids without being limited to one kind of organic chemical liquid (containing an aqueous solution). As for the first chemical liquid, a chemical liquid which contains, for example, a large amount of particles compared to the second chemical liquid, or a chemical liquid apt to deteriorate due to, for example, the elapse of time or the reaction with the second chemical liquid may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing apparatus comprising:
    a substrate liquid processing unit configured to process a substrate disposed therein using a processing liquid;
    a processing liquid storage unit configured to store the processing liquid;
    a processing liquid supply unit configured to supply the processing liquid from the processing liquid storage unit to the substrate disposed in the substrate liquid processing unit;
    a first chemical liquid supply unit configured to supply a first chemical liquid to the processing liquid storage unit;
    a second chemical liquid supply unit configured to supply a second chemical liquid to the processing liquid storage unit;
    a chemical liquid purifying unit configured to circulate and purify the first chemical liquid stored in the processing liquid storage unit; and
    a control unit configured to control the processing liquid supply unit, the first chemical liquid supply unit, the second chemical liquid supply unit, and the chemical liquid purifying unit such that the first chemical liquid and the second chemical liquid are mixed together to produce the processing liquid,
    wherein the chemical liquid purifying unit includes a chemical liquid purifying flow line directly connected to the processing liquid storage unit and a filter provided in the chemical liquid purifying flow line, and the first chemical liquid is circulated between the processing liquid storage unit and the chemical liquid purifying flow line using the filter,
    wherein the processing liquid storage unit includes a first storage tank and a second storage tank, and
    wherein the chemical liquid purifying unit includes a common first chemical liquid purifying flow line connected to the first and second storage tanks, and a second chemical liquid purifying flow line which diverges from the processing liquid supply unit and connects to the first and second storage tanks.

2. The substrate liquid processing apparatus of claim 1, further comprising:
    a heating unit configured to heat the processing liquid stored in the processing liquid storage unit,
    wherein the control unit is configured to drive the heating unit after the second chemical liquid is supplied to the processing liquid storage unit by the second chemical liquid supply unit.

3. The substrate liquid processing apparatus of claim 2, wherein the control unit is configured to produce the processing liquid by mixing the first chemical liquid with the second chemical liquid, after the second chemical liquid is supplied to the processing liquid storage unit but before the processing liquid is supplied to the substrate liquid processing unit, and
    the control unit is configured to drive the heating unit while the processing liquid is being produced.

4. The substrate liquid processing apparatus of claim 3, wherein the control unit is configured to supply the first chemical liquid to the processing liquid storage unit at least before a first predetermined timing counting from a timing when the heating unit is heated, the second chemical liquid is supplied to the processing liquid storage unit at least before a second predetermined timing counting from the timing when the heating unit is heated, and the processing liquid is supplied to the substrate liquid processing unit when the processing liquid is heated up to a predetermined temperature.

5. The substrate liquid processing apparatus of claim 1, wherein the control unit is configured to purify the first chemical liquid for a length of time longer than a length of time from initiation of supplying the second chemical liquid to initiation of supplying the processing liquid to the substrate liquid processing unit.

6. The substrate liquid processing apparatus of claim 1, wherein the control unit is configured to supply the first chemical liquid, purify the first chemical liquid, and supply the second chemical liquid using the second storage tank while the processing liquid is supplied to the substrate liquid processing unit using the first storage tank, and the control unit is configured to supply the processing liquid using the second storage tank after the processing liquid is supplied to the substrate liquid processing unit using the first storage tank.

7. The substrate liquid processing apparatus of claim 6, wherein while the processing liquid is supplied to the substrate liquid processing unit using the first storage tank, the control unit circulates a purified processing liquid through the second chemical liquid purifying flow line and purifies the first chemical liquid stored in the second storage tank through the first chemical liquid purifying flow line.

8. The substrate liquid processing apparatus of claim 6, wherein the control unit supplies the processing liquid to the substrate liquid processing unit using the first storage tank, after the processing liquid is supplied to the substrate liquid processing unit using the first storage tank, the control unit discharges the processing liquid stored in the first storage tank and then supplies the first chemical liquid to the first storage tank, and the control unit supplies the second chemical liquid to the first storage tank ahead of supplying the processing liquid to the first storage tank by a predetermined length of time ahead of the supplying of the processing liquid to the first storage tank.

9. A method of performing a liquid processing on a substrate using a processing liquid, the method comprising:

supplying a first chemical liquid to a storage unit;

providing a chemical liquid purifying flow line directly connected to the storage unit and a filter in the chemical liquid purifying flow line;

providing a chemical liquid purifying unit to circulate the first chemical liquid between the storage unit and the chemical liquid purifying flow line using the filter, thereby purifying the first chemical liquid;

supplying a second chemical liquid to the storage tank;

producing the processing liquid by mixing the first chemical liquid and the second chemical liquid; and supplying a processing liquid supply unit to supply the processing liquid from the storage unit to the substrate;

wherein the storage unit includes a first storage tank and a second storage tank, and wherein the chemical liquid purifying unit includes a common first chemical liquid purifying flow line connected to the first and second storage tanks, and a second chemical liquid purifying flow line which diverges from the processing liquid supply unit and connects to the first and second storage tanks.

10. The method of claim 9, further comprising heating the processing liquid after the second chemical liquid is supplied to the storage tank.

11. The method of claim 10, wherein the heating of the processing liquid is initiated while the processing liquid is being produced.

12. The method of claim 11, wherein supplying the first chemical liquid to the storage tank is initiated at least before a first predetermined timing counting from a timing when the heating is initiated, supplying the second chemical liquid to the storage tank is initiated at least before a second predetermined timing counting from the timing when the heating is initiated, and the supplying the processing liquid to the substrate is initiated when the processing liquid is heated up to a predetermined temperature.

13. The method of claim 9, wherein the purifying is executed for a length of time longer than a length of time from initiation of supplying the second chemical liquid to the storage tank to initiation of supplying the processing liquid to the substrate.

14. The method of claim 9, wherein the first storage tank or the second storage tank is used as the storage unit, and the method further comprising:

while supplying the processing liquid to the substrate using the first storage tank, supplying the first chemical liquid, purifying the first chemical liquid, and supplying the second chemical liquid supply using the second storage tank, after supplying of the processing liquid using the first storage tank is finished, supplying the processing liquid using the second storage tank, discharging the processing liquid stored in the first storage tank, and supplying the first chemical liquid using the first storage tank, and supplying the second chemical liquid using the first storage tank ahead of a following step of supplying the processing liquid using the first storage tank by a predetermined length of time ahead of the following step of supplying the processing liquid using the first storage tank.

* * * * *